(12) United States Patent
Yoshida et al.

(10) Patent No.: US 12,348,240 B2
(45) Date of Patent: Jul. 1, 2025

(54) COMPARATOR CIRCUIT AND A/D CONVERTER

(71) Applicant: Socionext Inc., Kanagawa (JP)

(72) Inventors: Itsuki Yoshida, Yokohama (JP); Takashi Morie, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 248 days.

(21) Appl. No.: 18/182,128

(22) Filed: Mar. 10, 2023

(65) Prior Publication Data

US 2023/0216518 A1 Jul. 6, 2023

Related U.S. Application Data

(63) Continuation of application No. PCT/JP2020/034920, filed on Sep. 15, 2020.

(51) Int. Cl.
*H03M 1/34* (2006.01)
*H03K 19/21* (2006.01)
*H03M 1/36* (2006.01)

(52) U.S. Cl.
CPC ............. *H03M 1/36* (2013.01); *H03K 19/21* (2013.01)

(58) Field of Classification Search
CPC .. H03M 1/125; H03M 1/0809; H03M 1/0863; H03M 1/0872; H03M 1/1014;
(Continued)

(56) References Cited

U.S. PATENT DOCUMENTS 5,917,359 A * 6/1999 Fukunaga ............ H03K 3/0375
327/381
5,990,814 A * 11/1999 Croman ............... H03M 1/1023
341/120
(Continued)

FOREIGN PATENT DOCUMENTS

JP S53-033355 U 3/1978
JP S58-010916 A 1/1983
(Continued)

OTHER PUBLICATIONS

Microfilm of the specification and drawings annexed to Japanese Utility Model Application No. 51-113901 (Publication No. 53-33355 ) (Yamatake-Honeywell Coq, Ltd.) (Year: 1978).*
(Continued)

*Primary Examiner* — Linh V Nguyen
(74) *Attorney, Agent, or Firm* — Rimon P.C.

(57) ABSTRACT

A comparator circuit outputs first and second digital signals corresponding to differential signals to a flip-flop having a predetermined forbidden input combination. A converter circuit performs differential amplification for the differential signals and converts the resultant signals to first and second signals that are complementary digital signals. A logic circuit performs predetermined logical operation, and when the logical values of the first and second signals are different from each other, outputs the first and second digital signals corresponding to the logical values of the first and second signals, and when the logical values of the first and second signals are the same, outputs the first and second digital signals having a same value other than the predetermined forbidden input combination.

5 Claims, 12 Drawing Sheets

(58) Field of Classification Search
CPC ...... H03M 1/1245; H03M 1/38; H03M 1/462; H03M 1/66; H03M 1/765; H03M 1/785; H03K 17/16; H03K 17/162; H03K 17/284; H03K 17/687; H03K 19/00315; H03K 19/018507; H03K 2217/0063
USPC .......................................... 341/155, 164, 165
See application file for complete search history.

(56) References Cited

U.S. PATENT DOCUMENTS

| | | | | |
|---|---|---|---|---|
| 8,299,836 | B2* | 10/2012 | Sakurai | H03K 19/0175 327/108 |
| 8,405,422 | B2* | 3/2013 | Akahane | H03K 19/018521 326/82 |
| 2015/0381180 | A1* | 12/2015 | Tsuji | H03K 19/017509 327/319 |
| 2016/0065205 | A1* | 3/2016 | Niikura | H02M 7/5387 318/504 |
| 2018/0183448 | A1* | 6/2018 | Segami | H03M 1/125 |
| 2019/0013817 | A1* | 1/2019 | Koli | H03M 1/466 |
| 2019/0131997 | A1* | 5/2019 | Liu | H03M 1/46 |
| 2021/0367608 | A1* | 11/2021 | Yi | H03M 1/202 |
| 2023/0299785 | A1* | 9/2023 | Singh | H03M 1/462 341/110 |

FOREIGN PATENT DOCUMENTS

| | | | |
|---|---|---|---|
| JP | H03-091314 A | 4/1991 | |
| JP | H09-200017 A | 7/1997 | |
| JP | 2002-314392 A | 10/2002 | |
| JP | 2002314392 | * 10/2002 | ............. H03K 17/16 |
| JP | 2006-333206 A | 12/2006 | |
| JP | 2012-244521 A | 12/2012 | |
| JP | 2016-046775 A | 4/2016 | |

OTHER PUBLICATIONS

International Search Report dated Oct. 20, 2020 issued in International Patent Application No. PCT/JP2020/034920, with English translation.
Written Opinion of the International Searching Authority dated Oct. 20, 2020 issued in International Patent Application No. PCT/JP2020/034920, with English translation.

* cited by examiner

FIG.1

FIG.2B  NOR TYPE

FIG.2A  NAND TYPE

FIG.3

TRUTH TABLE

| $\overline{QP}$ | $\overline{QN}$ | XQP | XQN |
|---|---|---|---|
| 0 | 0 | 1 | 1 |
| 0 | 1 | 0 | 1 |
| 1 | 0 | 1 | 0 |
| 1 | 1 | 1 | 1 |

FIG.8B WITH DELAY CIRCUIT

FIG.8A WITHOUT DELAY CIRCUIT

COMPARATOR CIRCUIT AND A/D CONVERTER

CROSS-REFERENCE TO RELATED APPLICATIONS

This is a continuation of International Application No. PCT/JP2020/034920 filed on Sep. 15, 2020. The entire disclosure of this application is incorporated by reference herein.

BACKGROUND

The present disclosure relates to a comparator circuit that outputs digital signals corresponding to differential signals.

A comparator circuit that outputs digital signals corresponding to differential signals compares two input voltages constituting a pair of differential signals and changes the values of the output digital signals depending on which one of the two input voltages is larger. Such a comparator circuit is used in an A/D converter, for example.

In recent years, with the growing speed of semiconductor integrated circuits, A/D converters are required to convert analog signals to digital signals rapidly and accurately. It is therefore necessary for comparator circuits used in A/D converters to compare differential signals rapidly and accurately.

Japanese Unexamined Patent Publication No. 2006-333206 discloses a differential-single converter circuit for converting differential input signals to pulse signals through a logic gate and outputting the resultant signals, in which edge detectors are inserted at a stage subsequent to the logic gate so as not to be affected by fluctuations in the threshold voltage of the logic gate.

In conventional comparator circuits, in some cases, when input differential signals have no potential difference, differential output signals obtained by differential amplification may both have an intermediate potential, whereby the digital signals output from the comparator circuit may have the same value. The digital signals output from the comparator circuit may be "11" or "00" depending on fluctuations in the threshold voltage of a logic gate provided at the output stage of the comparator circuit. In this case, when a flip-flop is present at a stage subsequent to the comparator circuit, there arises a possibility that a forbidden input combination may be given to the flip-flop, which is undesirable.

An objective of the present disclosure is providing a comparator circuit outputting digital signals corresponding to differential signals, which is made not to output a forbidden input combination to a subsequent flip-flop even when the differential signals have no potential difference.

SUMMARY

According to one mode of the present disclosure, a comparator circuit receiving differential signals and outputting first and second digital signals corresponding to the differential signals to a flip-flop having a predetermined forbidden input combination includes: a converter circuit performing differential amplification for the differential signals and converting the resultant signals to first and second signals that are complementary digital signals; and a logic circuit performing predetermined logical operation for the input first and second signals and outputting the first and second digital signals, wherein when the first and second signals have logical values different from each other, the logic circuit outputs the first and second digital signals corresponding to the logical values of the first and second signals, and when the first and second signals have a same logical value, the logic circuit outputs the first and second digital signals having a same value other than the predetermined forbidden input combination.

According to the above mode, in the comparator circuit, the input differential signals are subjected to differential amplification and converted to the first and second signals that are complementary digital signals. The logic circuit performs predetermined logical operation, and when the first and second signals have logical values different from each other, outputs the first and second digital signals corresponding to the logical values of the first and second signals. On the other hand, when the first and second signals have the same logical value, the logic circuit outputs the first and second digital signals having a same value other than the predetermined forbidden input combination of the subsequent flip-flop. That is, when the first and second signals output from the converter circuit have the same logical value, signals other than the predetermined forbidden input combination of the flip-flop are output as the first and second digital signals. Therefore, even when there is no potential difference between the differential signals and resultantly the first and second signals output from the converter circuit have the same logical value, it is possible to avoid input of the forbidden input combination into the subsequent flip-flop.

According to the present disclosure, a comparator circuit outputting digital signals corresponding to differential signals can be made not to output a forbidden input combination to a subsequent flip-flop even when the differential signals have no potential difference.

DETAILED DESCRIPTION

Embodiments of the present disclosure will be described hereinafter with reference to the accompanying drawings. Note that the circuit configuration diagrams to follow are illustrated in a simplified manner focusing on components related to the present disclosure. Therefore, in some cases, for example, components illustrated as being directly connected to each other may be connected indirectly with another component placed between them in an actual circuit configuration.

In the following description, "HIGH" and "LOW" or "1" and "0" of signals represent the high-potential side and low-potential side logical levels of the signals. Also, "ON" or "OFF" of a transistor represents whether the transistor is conductive or nonconductive.

First Embodiment

Figure 1:
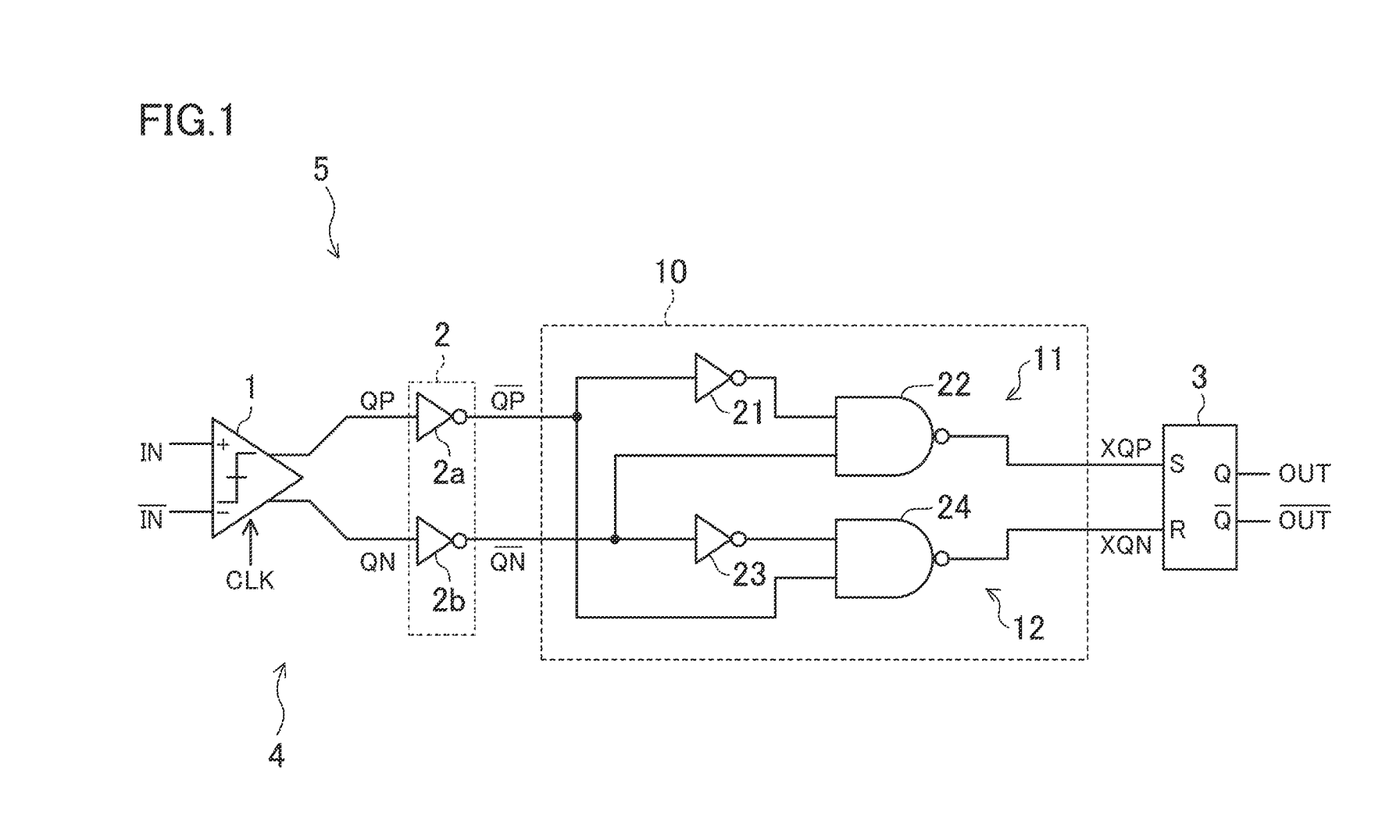
FIG. 1 is a circuit diagram showing a configuration including a comparator circuit according to the first embodiment.

FIG. 1 is a circuit diagram showing a configuration including a comparator circuit according to the first embodiment. In FIG. 1, a comparator circuit 5 receives differential signals IN and /IN as its inputs and outputs digital signals XQP and XQN corresponding to the differential signals IN and /IN to an RS flip-flop 3. The comparator circuit 5 includes a comparator 1, a logic gate 2, and a logic circuit 10. The comparator 1 is a circuit having an analog/digital conversion function, where the differential signals IN and /IN are subjected to differential amplification and converted to complementary digital signals QP and QN. The logic gate 2, having inverters 2a and 2b, inverts the signals QP and QN output from the comparator 1 and outputs signals /QP and /QN. The comparator 1 and the logic gate 2 constitute a converter circuit 4 according to the present disclosure. The logic circuit 10 performs logical operation using the signals /QP and /QN received from the logic gate 2 as its inputs and outputs digital signals XQP and XQN.

Figure 2A:
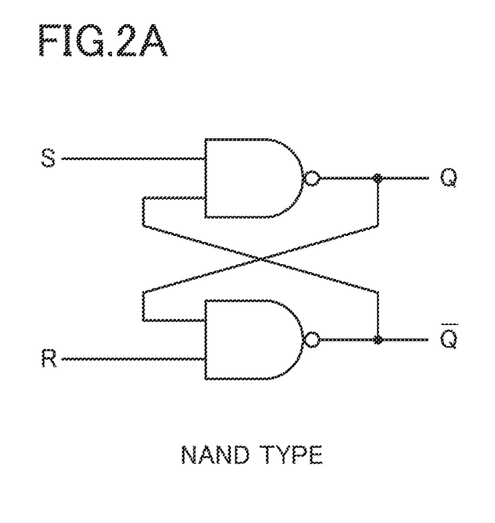
FIGS. 2A-2B show circuit configuration examples of flip-flops.
Figure 2B:
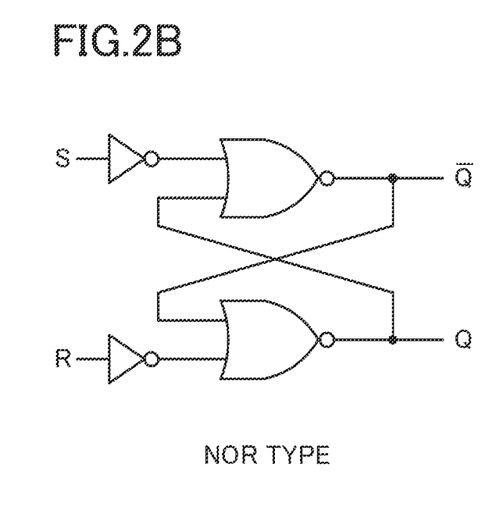

The RS flip-flop 3 receives the digital signal XQP as S input and the digital signal XQN as R input, and outputs a signal OUT from Q output and a signal /OUT from /Q output. In this embodiment, "00" (S=0, R=0) is a forbidden input combination for the RS flip-flop 3. FIGS. 2A and 2B show circuit configuration examples of the RS flip-flop 3, where FIG. 2A is of a NAND type using NAND gates and FIG. 2B is of a NOR type using NOR gates.

The logic circuit 10 includes a first circuit 11 that receives the signals /QP and /QN and outputs the digital signal XQP and a second circuit 12 that receives the signals /QP and /QN and outputs the digital signal XQN. The first circuit 11 includes an inverter 21 receiving the signal /QP and a NAND gate 22 receiving the signal /QN and the output signal of the inverter 21 as its inputs. The second circuit 12 includes an inverter 23 receiving the signal /QN and a NAND gate 24 receiving the signal /QP and the output signal of the inverter 23 as its inputs.

Figure 3:
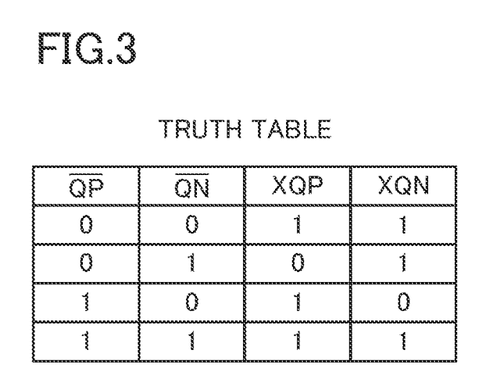
FIG. 3 is a truth table showing logical operation by a logic circuit in the comparator circuit of FIG. 1.

FIG. 3 is a truth table representing the logical operation performed by the logic circuit 10. As shown in FIG. 3, when the logical values of the signals /QP and /QN are different from each other, the digital signals XQP and XQN have the same logical values as the signals /QP and /QN, respectively. On the other hand, when the logical values of the signals /QP and /QN are the same, the values of the digital signals XQP and XQN are "11". That is, the values of the digital signals XQP and XQN never become "00".

The comparator 1 outputs HIGH, i.e., voltage VDD before start of comparison operation, i.e., when a clock signal CLK is LOW. Once the clock signal CLK rises to HIGH, the comparator starts comparison operation. In the comparison operation, when the potential of the signal IN is higher than that of the signal /IN, the comparator 1 outputs HIGH as the signal QP and LOW as the signal QN. At this time, the logic gate 2 outputs "01" as the signals /QP and /QN. On the other hand, when the potential of the signal IN is lower than that of the signal /IN, the comparator 1 outputs LOW as the signal QP and HIGH as the signal QN. At this time, the logic gate 2 outputs "10" as the signals /QP and /QN.

Figure 4:
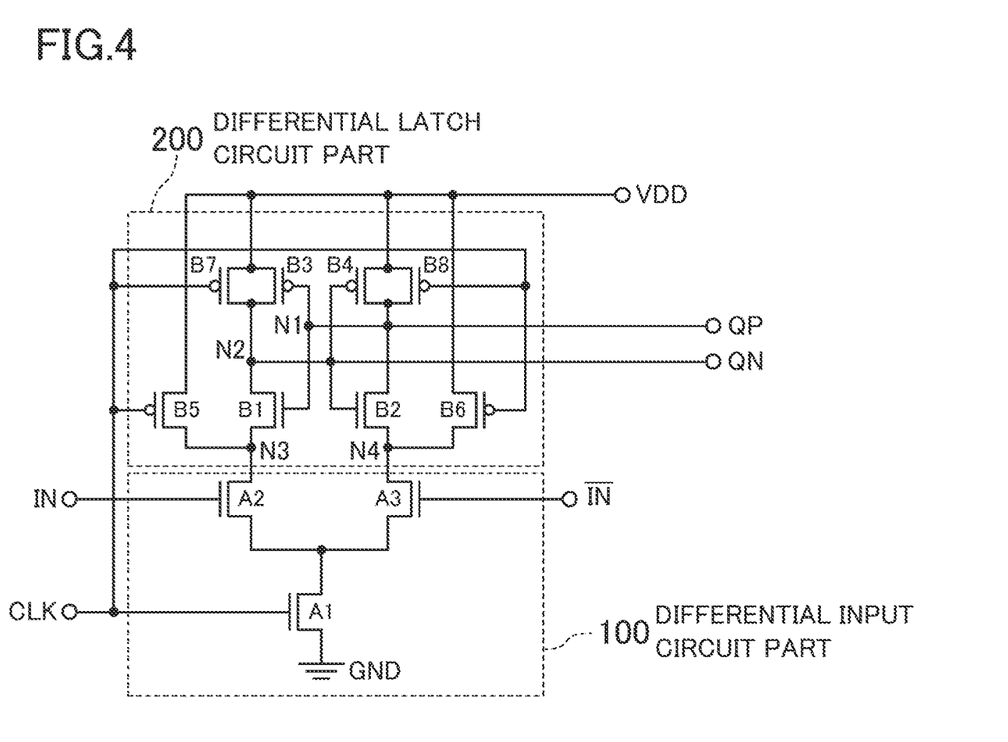
FIG. 4 shows a circuit configuration example of a comparator in the comparator circuit of FIG. 1.

FIG. 4 shows a circuit configuration example of the comparator 1. In FIG. 4, a latch-type comparator with clock input is shown.

In FIG. 4, a differential input circuit part 100 includes three NMOS transistors A1 to A3. The clock signal CLK, the signal IN, and the signal /IN are given to the gates of the transistors A1 to A3, respectively.

A differential latch circuit part 200 includes two NMOS transistors B1 and B2 and six PMOS transistors B3 to B8. The transistors B1 and B3 are mutually connected at their drains and gates, and the transistors B2 and B4 are mutually connected at their drains and gates. The sources of the transistors B1 and B2 are connected with the drains of the transistors A2 and A3 of the differential input circuit part 100 (at nodes N3 and N4), respectively. The sources of the transistors B3 and B4 are connected with the power supply terminal VDD. The gates of the transistors B1 and B3 and the drains of the transistors B2 and B4 are mutually connected, forming an output node N1. The drains of the transistors B1 and B3 and the gates of the transistors B2 and B4 are mutually connected, forming an output node N2. The signals QP and QN are output from the output nodes N1 and N2, respectively. The transistors B5 and B6 are connected between the power supply terminal VDD and the nodes N3 and N4, respectively. The transistors B7 and B8 are connected between the power supply terminal VDD and the nodes N2 and N1, respectively. The clock signal CLK is given to the gates of the transistors B5 to B8.

The circuit of FIG. 4 starts comparison operation when the clock signal CLK rises to HIGH. At this time, the transistor A1 turns ON and the transistors B5 to B8 turn OFF. When the potential of the signal IN is higher than that of the signal /IN, for example, the current flowing through the transistor A2 is greater than the current flowing through the transistor A3. This changes the potential of the node N3 to LOW earlier than that of the node N4. At this time, when the potential of the node N2 falls earlier than that of the node N1 and changes to LOW, the transistor B4 turns ON, allowing a current to flow from the power supply terminal VDD to the node N1 and changing the potential of the node N1 to HIGH. That is, HIGH is output as the signal QP and LOW is output as the signal QN. Similarly, when the potential of the signal /IN is higher than that of the signal IN, LOW is output as the signal QP and HIGH is output as the signal QN.

The circuit configuration of the comparator 1 is not limited to that shown in FIG. 4. For example, in the configuration of FIG. 4, the transistors B5 and B6 may be omitted. Also, the differential latch circuit part may be connected laterally to the differential input circuit part. Otherwise, the comparator 1 may be a hysteresis-type comparator.

When there is no potential difference between the differential signals IN and /IN, the comparator 1 outputs an intermediate potential as both the signals QP and QN. At this time, the logic gate 2 outputs "00" or "11" as the signals /QP and /QN depending on which is larger, its threshold voltage or the intermediate potential output from the comparator 1. The threshold voltage of the logic gate 2 however varies with factors such as the production process. Therefore, when there is no potential difference between the differential signals IN and /IN, the signals /QP and /QN output from the logic gate 2 may be "00" or "11", failing to be uniquely determined. In this embodiment, by providing the logic circuit 10, the forbidden input combination "00" is avoided from being given to the RS flip-flop 3.

Figure 5A:
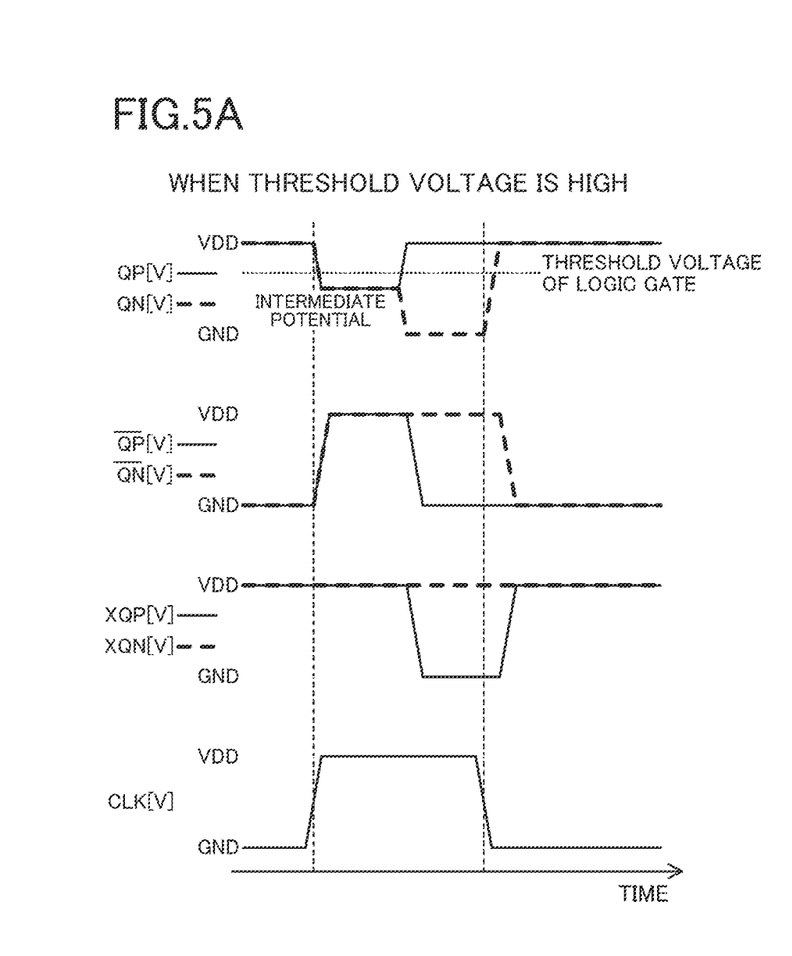
FIGS. 5A-5B show operation examples of the comparator circuit according to the first embodiment.
Figure 5B:
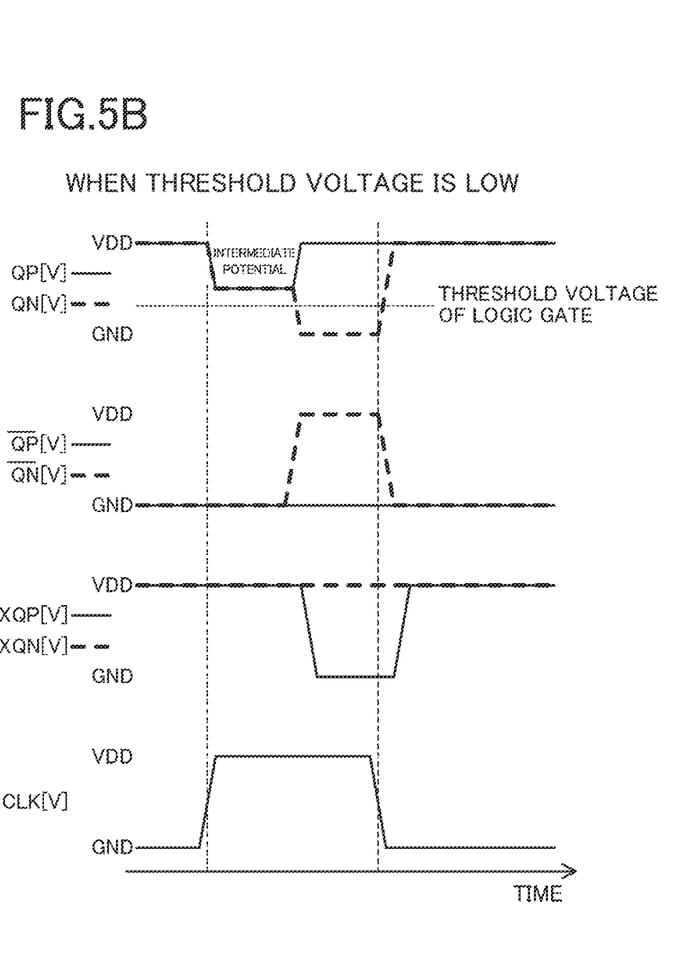

FIGS. 5A and 5B are waveform diagrams showing operation examples of the comparator circuit according to this embodiment, in which FIG. 5A shows the case where the threshold voltage of the logic gate 2 is higher than the intermediate potential output from the comparator 1 and FIG. 5B shows the case where the threshold voltage is lower than the intermediate potential.

As shown in FIG. 5A, in the case where the threshold voltage of the logic gate 2 is higher than the intermediate potential output from the comparator 1, when the intermediate potential is output from the comparator 1, the outputs (/QP and /QN) of the logic gate 2 are "11" because the intermediate potential is lower than the threshold voltage. At this time, the outputs (XQP and XQN) of the logic circuit 10 are "11" as indicated in the truth table of FIG. 3. Also, as shown in FIG. 5B, in the case where the threshold voltage of the logic gate 2 is lower than the intermediate potential output from the comparator 1, when the intermediate potential is output from the comparator 1, the outputs (/QP and /QN) of the logic gate 2 are "00" because the intermediate potential is higher than the threshold voltage. At this time, the outputs (XQP and XQN) of the logic circuit 10 are "11" as indicated in the truth table of FIG. 3. That is, even if the threshold voltage of the logic gate 2 varies, there are no cases where the outputs (XQP and XQN) of the logic circuit 10 become the forbidden input combination "00" of the RS flip-flop 3 when the intermediate potential is output from the comparator 1 because of no potential difference between the differential signals IN and /IN.

As described above, according to this embodiment, in the comparator circuit 5, the input differential signals IN and /IN are subjected to differential amplification and converted to the complementary digital signals /QP and /QN by the converter circuit 4. The logic circuit 10 performs predetermined logical operation and, when the signals /QP and /QN have logical values different from each other, outputs the digital signals XQP and XQN corresponding to the logical values of the signals /QP and /QN. On the other hand, when the signals /QP and /QN have the same logical value, the logic circuit 10 outputs "11". That is, when the signals /QP and /QN have the same logical value, "11", which is constituted by the same value but is not the forbidden input combination "00" of the flip-flop 3, is output as the digital signals XQP and XQN. Therefore, even when there is no potential difference between the differential signals IN and /IN and resultantly the signals /QP and /QN output from the converter circuit 4 have the same logical value, it is possible to avoid input of the forbidden input combination into the subsequent flip-flop 3.

<Alteration>

In the above-described embodiment, the comparator 1 was assumed to output HIGH, i.e., the voltage VDD before start of comparison operation. Alternatively, the comparator 1 may output LOW, i.e., the ground GND before start of comparison operation. For example, in the circuit configuration of FIG. 4, the power supply VDD and the ground GND may be inverted, the NMOS transistors may be replaced with PMOS transistors, and the PMOS transistors may be replaced with NMOS transistors. With this circuit configuration, LOW will be output before start of comparison operation.

In the above case, also, by providing the logic circuit 10, the inputs of the RS flip-flop 3 never become the forbidden input combination "00".

Figure 6A:
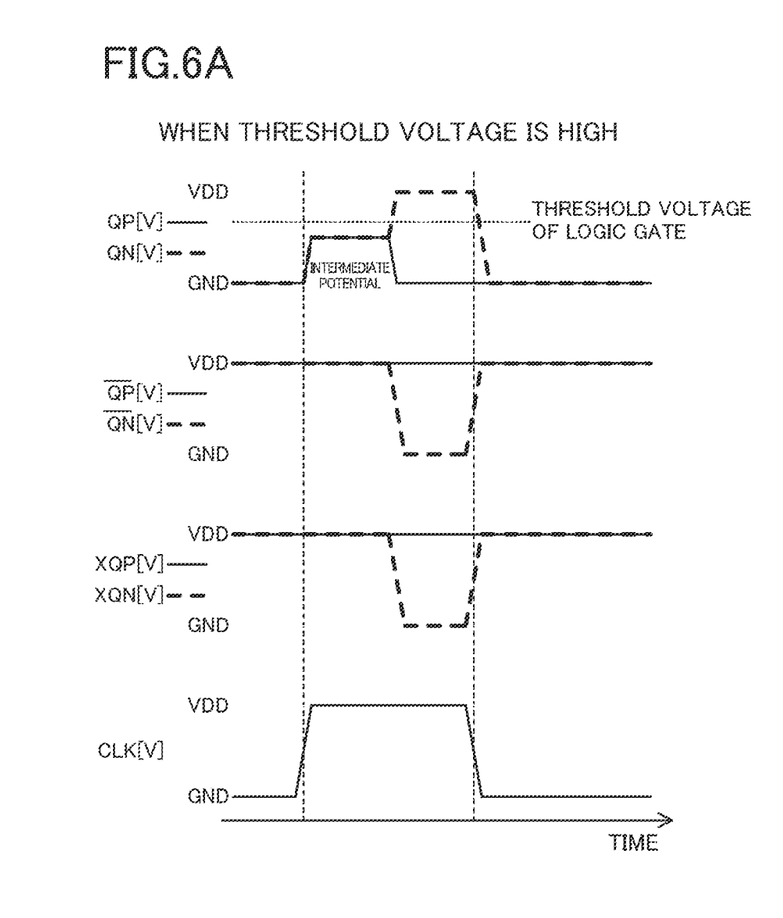
FIGS. 6A-6B show operation examples of the comparator circuit according to an alteration.
Figure 6B:
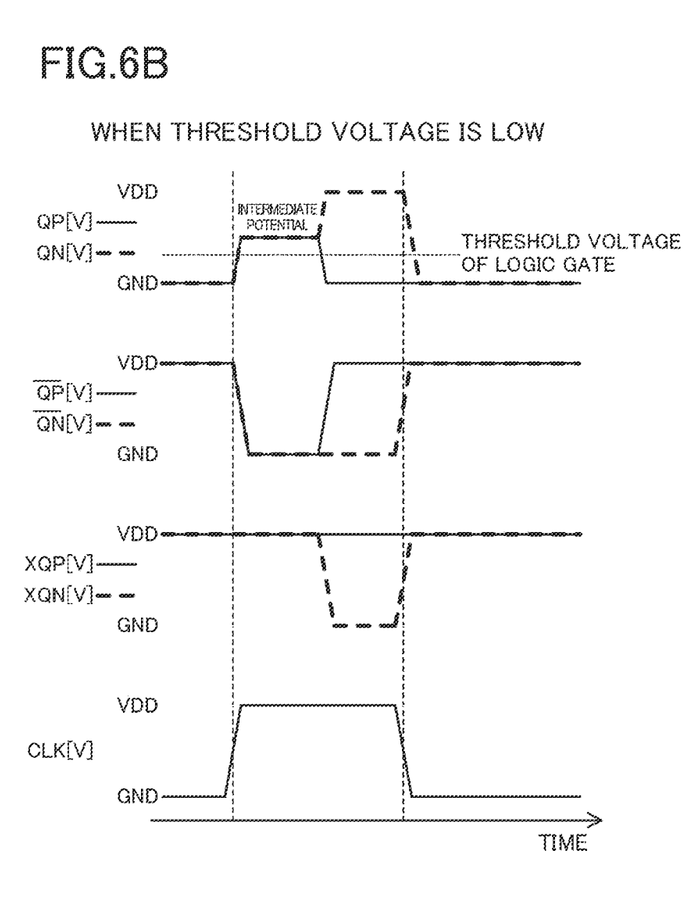

FIGS. 6A and 6B are waveform diagrams showing operation examples of the comparator circuit according to this alteration, in which FIG. 6A shows the case where the threshold voltage of the logic gate 2 is higher than the intermediate potential output from the comparator 1 and FIG. 6B shows the case where the threshold voltage is lower than the intermediate potential.

As shown in FIG. 6A, in the case where the threshold voltage of the logic gate 2 is higher than the intermediate potential output from the comparator 1, when the intermediate potential is output from the comparator 1, the outputs (/QP and /QN) of the logic gate 2 are "11" because the intermediate potential is lower than the threshold voltage. At this time, the outputs (XQP and XQN) of the logic circuit 10 are "11" as indicated in the truth table of FIG. 3. Also, as shown in FIG. 6B, in the case where the threshold voltage of the logic gate 2 is lower than the intermediate potential output from the comparator 1, when the intermediate potential is output from the comparator 1, the outputs (/QP and /QN) of the logic gate 2 are "00" because the intermediate potential is higher than the threshold voltage. At this time, the outputs (XQP and XQN) of the logic circuit 10 are "11" as indicated in the truth table of FIG. 3.

Second Embodiment

Figure 7:
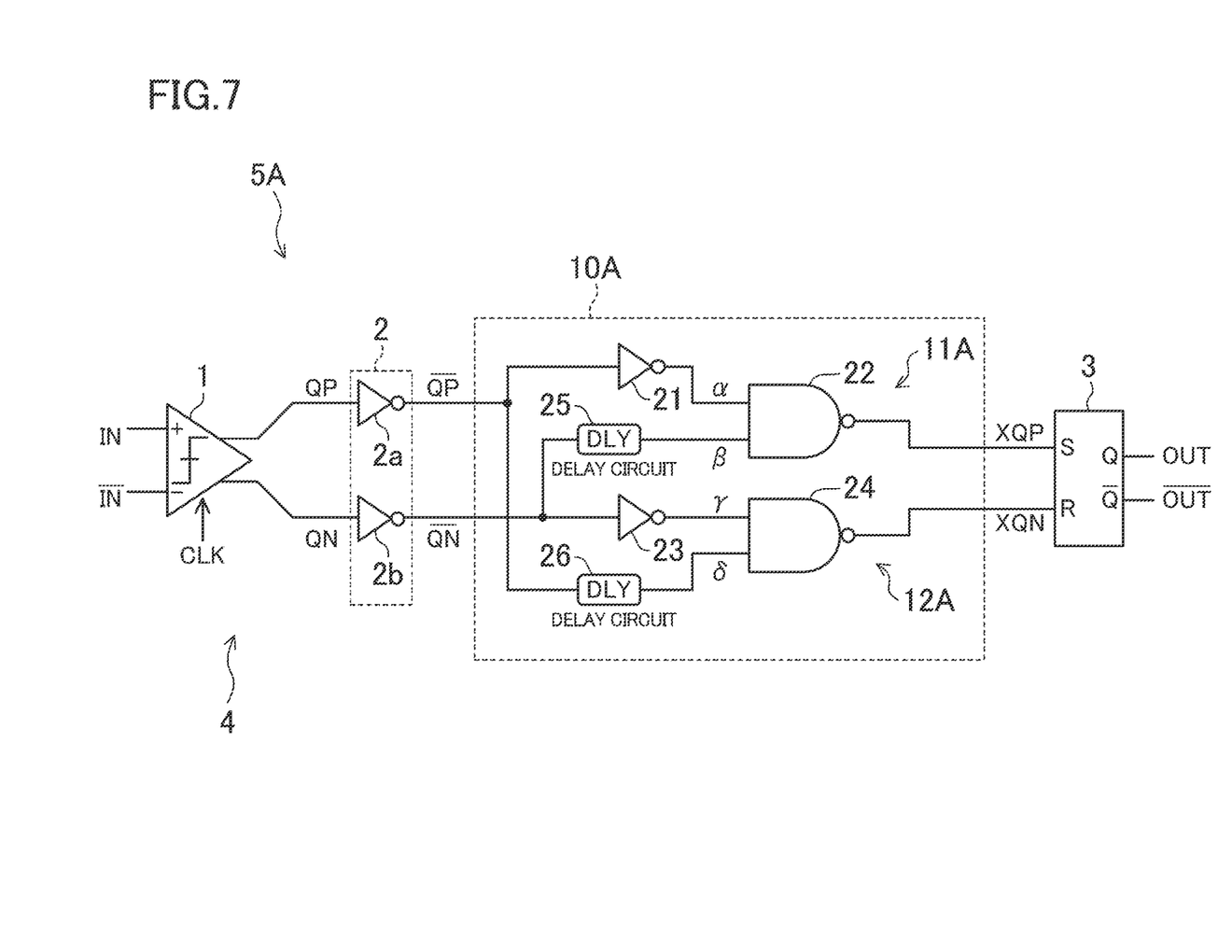
FIG. 7 is a circuit diagram showing a configuration including a comparator circuit according to the second embodiment.

FIG. 7 is a circuit diagram showing a configuration including a comparator circuit according to the second embodiment. In FIG. 7, the configuration of a logic circuit 10A is different from that of the logic circuit 10 shown in FIG. 1. That is, in the logic circuit 10A, a first circuit 11A that receives the signals /QP and /QN and outputs the digital signal XQP includes a delay circuit 25 in addition to the inverter 21 and the NAND gate 22, and a second circuit 12A that receives the signals /QP and /QN and outputs the digital signal XQN includes a delay circuit 26 in addition to the inverter 23 and the NAND gate 24. The delay circuit 25 delays the signal /QN and outputs the delayed signal to the NAND gate 22, and the delay circuit 26 delays the signal /QP and outputs the delayed signal to the NAND gate 24. The delay circuits 25 and 26 may be implemented by a CMOS switch or a unity gain buffer, for example.

The logical operation performed by the logic circuit 10A is the same as that by the logic circuit 10 shown in FIG. 1, which is as represented by the truth table of FIG. 3. That is, when the logical values of the signals /QP and /QN are different from each other, the digital signals XQP and XQN have the same logical values as the signals /QP and /QN, respectively. On the other hand, when the logical values of the signals /QP and /QN are the same, the values of the digital signals XQP and XQN are "11". That is, the values of the digital signals XQP and XQN output from the logic circuit 10A never become "00".

Moreover, in this embodiment, by adding the delay circuit 25, 26 to one route of the NAND inputs, the difference in the input routes of the NAND gate is reduced. This prevents generation of a minute pulse in one or both of the signals XQP and XQN. A minute pulse may be generated when the timing of the two inputs of the NAND gate 22 is off due to variations in the delay of the inverter 21 and when the timing of the two inputs of the NAND gate 24 is off due to variations in the delay of the inverter 23. A minute pulse may also be generated when a difference arises in voltage drop speed between the signals QP and QN due to variations in the inverter capability of the latch circuits in the comparator 1, resulting in the timing of the rises of the signals /QP and /QN becoming off.

Figure 8A:
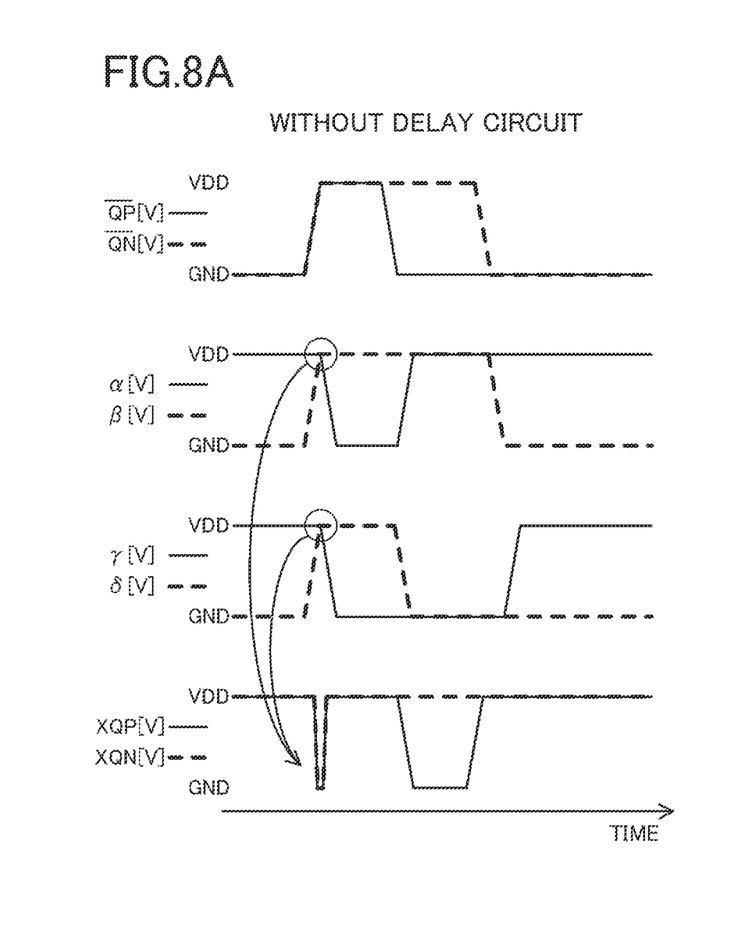
FIG. 8A shows an operation example of a comparator circuit having no delay circuit.
Figure 8B:
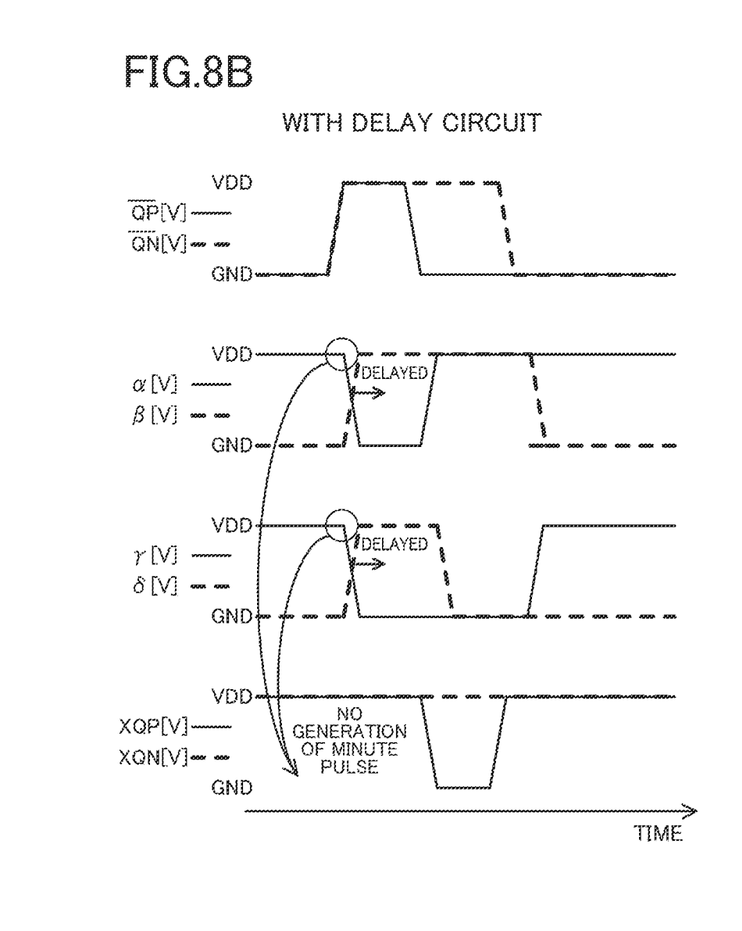
FIG. 8B shows an operation example of the comparator circuit having delay circuits according to the second embodiment.

FIGS. 8A-8B show operation examples of comparator circuits performed when the timing of the two inputs of the NAND gate 22, 24 is off, where FIG. 8A shows a case of having no delay circuit, and FIG. 8B shows a case of having a delay circuit, i.e., the case of the comparator circuit according to this embodiment. Note that α and β denote the inputs of the NAND gate 22 and γ and δ denote the inputs of the NAND gate 24.

As shown in FIG. 8A, in the case of having no delay circuit, when both the signals /QP and /QN have risen, the fall of the signal α lags behind the rise of the signal β because of the inverter 21. This raises the possibility that a minute pulse may be generated in the output XQP of the NAND gate 22. Also, the fall of the signal γ lags behind the rise of the signal δ because of the inverter 23, and this raises the possibility that a minute pulse may be generated in the output XQN of the NAND gate 24. As a result, there is a possibility that the values of the digital signals XQP and XQN may temporarily become "00", which is the forbidden input combination for the RS flip-flop 3. This may therefore cause a malfunction of the circuit.

On the other hand, as shown in FIG. 8B, since the comparator circuit according to this embodiment has the delay circuit 25, the rise of the input β is delayed, whereby generation of a minute pulse in the output XQP of the NAND gate 22 is prevented. Also, since the delay circuit 26 is provided, the rise of the input δ is delayed, whereby generation of a minute pulse in the output XQN of the NAND gate 24 is prevented. As a result, the possibility of the values of the digital signals XQP and XQN becoming "00" is avoided.

Figure 9A:
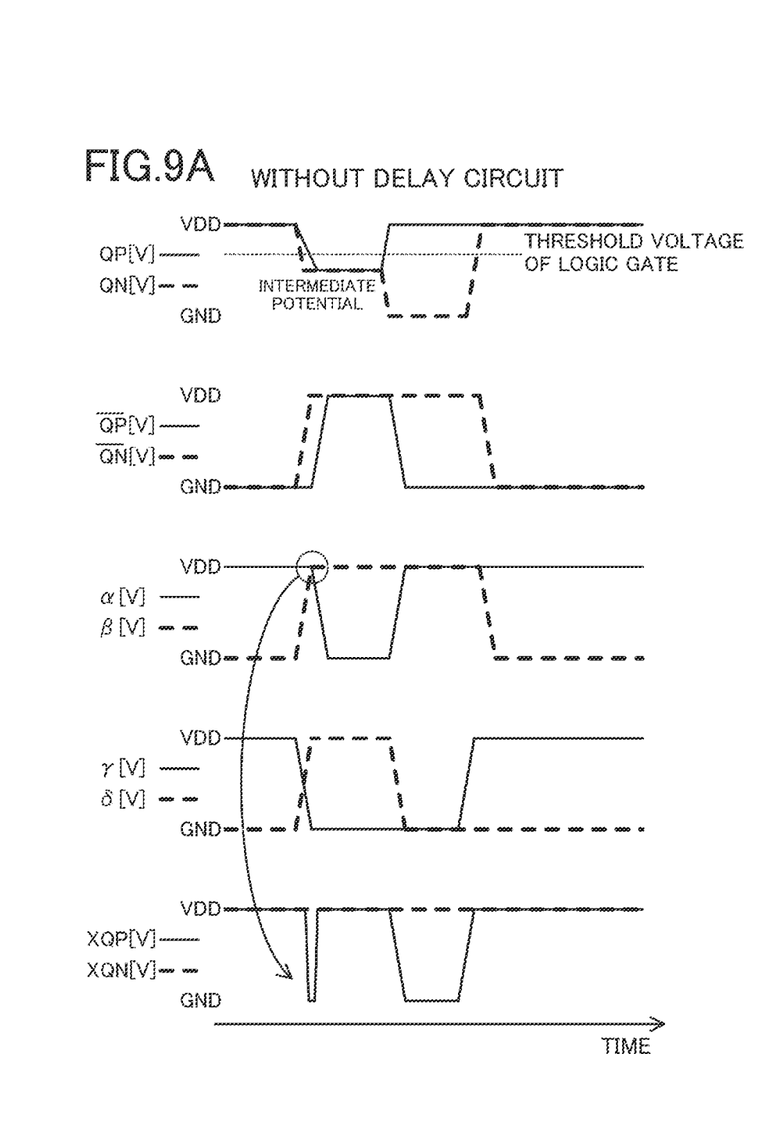
FIG. 9A shows an operation example of a comparator circuit having no delay circuit.
Figure 9B:
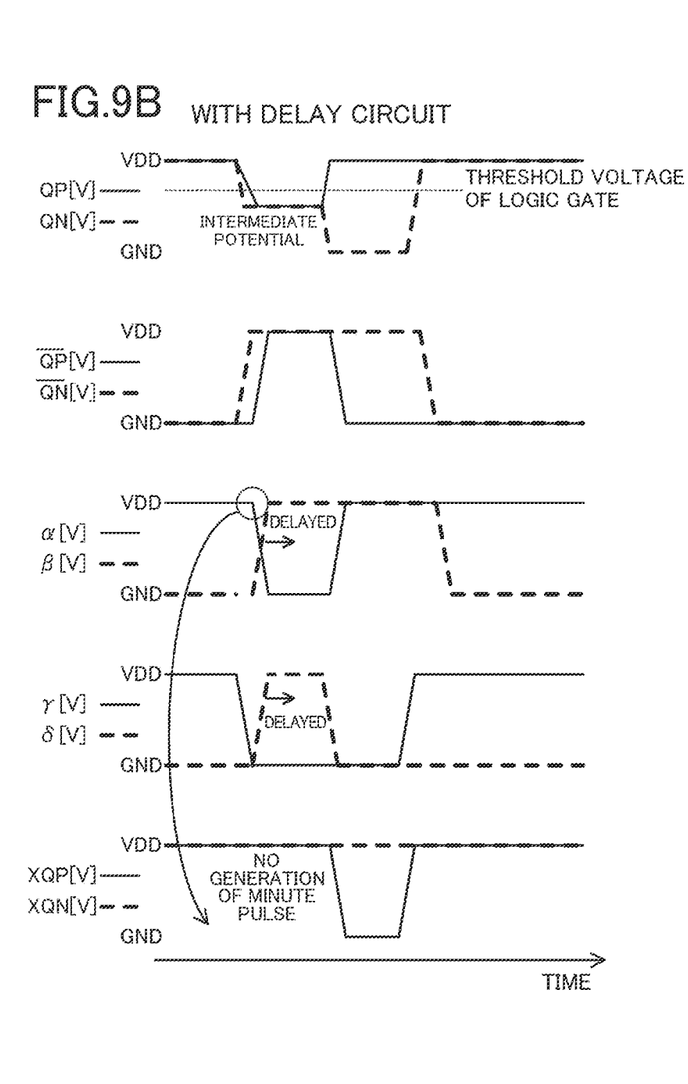
FIG. 9B shows an operation example of the comparator circuit having delay circuits according to the second embodiment.

FIGS. 9A-9B show operation examples of comparator circuits performed when the timing of the rises of the signals /QP and /QN is off, where FIG. 9A shows a case of having no delay circuit, and FIG. 9B shows a case of having a delay circuit, i.e., the case of the comparator circuit according to this embodiment. Note that α and β denote the inputs of the NAND gate 22 and γ and δ denote the inputs of the NAND gate 24.

In FIGS. 9A-9B, assume that, out of the outputs QP and QN of the comparator 1, the output QN falls faster than the output QP. Therefore, the rise of the signal /QP is late behind the rise of the signal /QN. As shown in FIG. 9A, in the case of having no delay circuit, the fall of the input α is late behind the rise of the input β. This raises the possibility that a minute pulse may be generated in the output XQP of the NAND gate 22. On the other hand, as shown in FIG. 9B, since the comparator circuit according to this embodiment has the delay circuit 25, the rise of the input β is delayed, whereby generation of a minute pulse in the output XQP of the NAND gate 22 is prevented.

Also, although illustration is omitted, when the output QP falls faster than the output QN, the rise of the signal /QN is late behind the rise of the signal /QP. In this case, in the case of having no delay circuit, there arises the possibility that a minute pulse may be generated in the output XQN of the NAND gate 24. However, since the comparator circuit according to this embodiment has the delay circuit 26, the rise of the input δ is delayed, whereby generation of a minute pulse in the output XQN of the NAND gate 24 is prevented.

As described above, in this embodiment, by providing the delay circuit 25, 26 on one of the input routes of the NAND gate 22, 24, generation of a minute pulse in the output XQP, XQN of the NAND gate 22, 24 can be prevented. In this way, input of the forbidden input combination into the subsequent flip-flop 3 can be avoided more reliably.

In this embodiment, as in the first embodiment, the comparator 1 can also be configured to output LOW before start of the comparison operation.

Third Embodiment

Figure 10A:
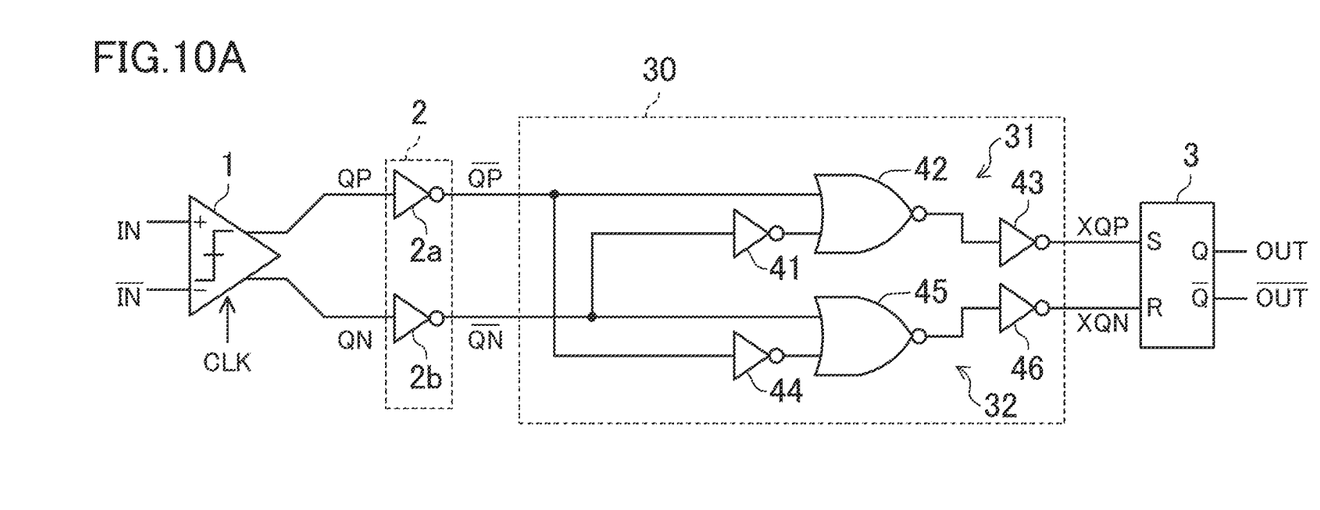
FIGS. 10A-10B are circuit diagrams showing configurations including a comparator circuit according to the third embodiment.

FIGS. 10A and 10B are circuit diagrams showing configurations including a comparator circuit according to the third embodiment. In the configuration of FIG. 10A, a logic circuit 30 uses a NOR gate. That is, the logic circuit 30 includes a first circuit 31 that receives the signals /QP and /QN and outputs the digital signal XQP and a second circuit 32 that receives the signals /QP and /QN and outputs the digital signal XQN. The first circuit 31 includes an inverter 41 receiving the signal /QN, a NOR gate 42 receiving the signal /QP and the output signal of the inverter 41 as its inputs, and an inverter 43 receiving the output of the NOR gate 42. The second circuit 32 includes an inverter 44 receiving the signal /QP, a NOR gate 45 receiving the signal /QN and the output signal of the inverter 44 as its inputs, and an inverter 46 receiving the output of the NOR gate 45.

The logical operation performed by the logic circuit 30 is the same as that by the logic circuit 10 shown in FIG. 1, which is as represented by the truth table of FIG. 3. That is, when the logical values of the signals /QP and /QN are different from each other, the digital signals XQP and XQN have the same logical values as the signals /QP and /QN, respectively. On the other hand, when the logical values of the signals /QP and /QN are the same, the values of the digital signals XQP and XQN are "11". That is, the values of the digital signals XQP and XQN never become "00".

Also, in the logic circuit 30, having the inverters 43 and 46 at the stage subsequent to the NOR gates 42 and 45, even when the outputs of the NOR gates 42 and 45 have dull waveforms, sharp rectangular pulses can be output as the digital signals XQP and XQN.

Figure 10B:
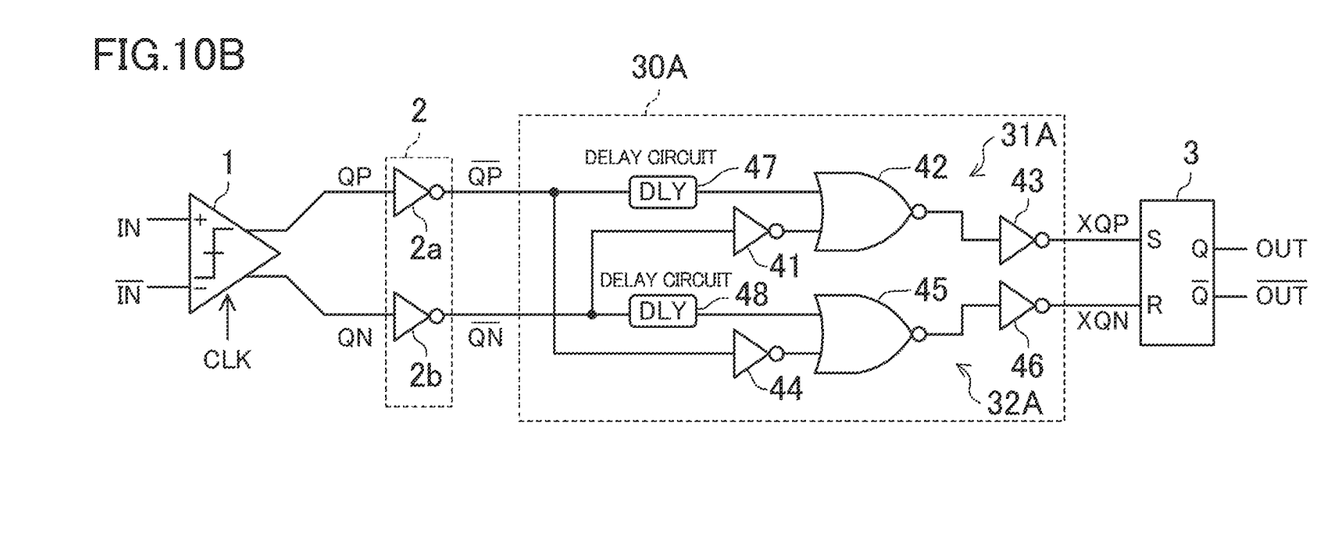

In the configuration of FIG. 10B, a logic circuit 30A includes delay circuits 47 and 48 in addition to the configuration of the logic circuit 30 of FIG. 10A. The delay circuit 47 delays the signal /QP and outputs the delayed signal to the NOR gate 42, and the delay circuit 48 delays the signal /QN and outputs the delayed signal to the NOR gate 45. The delay circuits 47 and 48 may be implemented by a CMOS switch or a unity gain buffer, for example.

In the configuration of FIG. 10B, as in the second embodiment, by adding the delay circuit 47, 48 to one route of the NOR inputs, the difference in the input routes of the NOR gate is reduced. This prevents generation of a minute pulse in one or both of the signals XQP and XQN.

Fourth Embodiment

Figure 11:
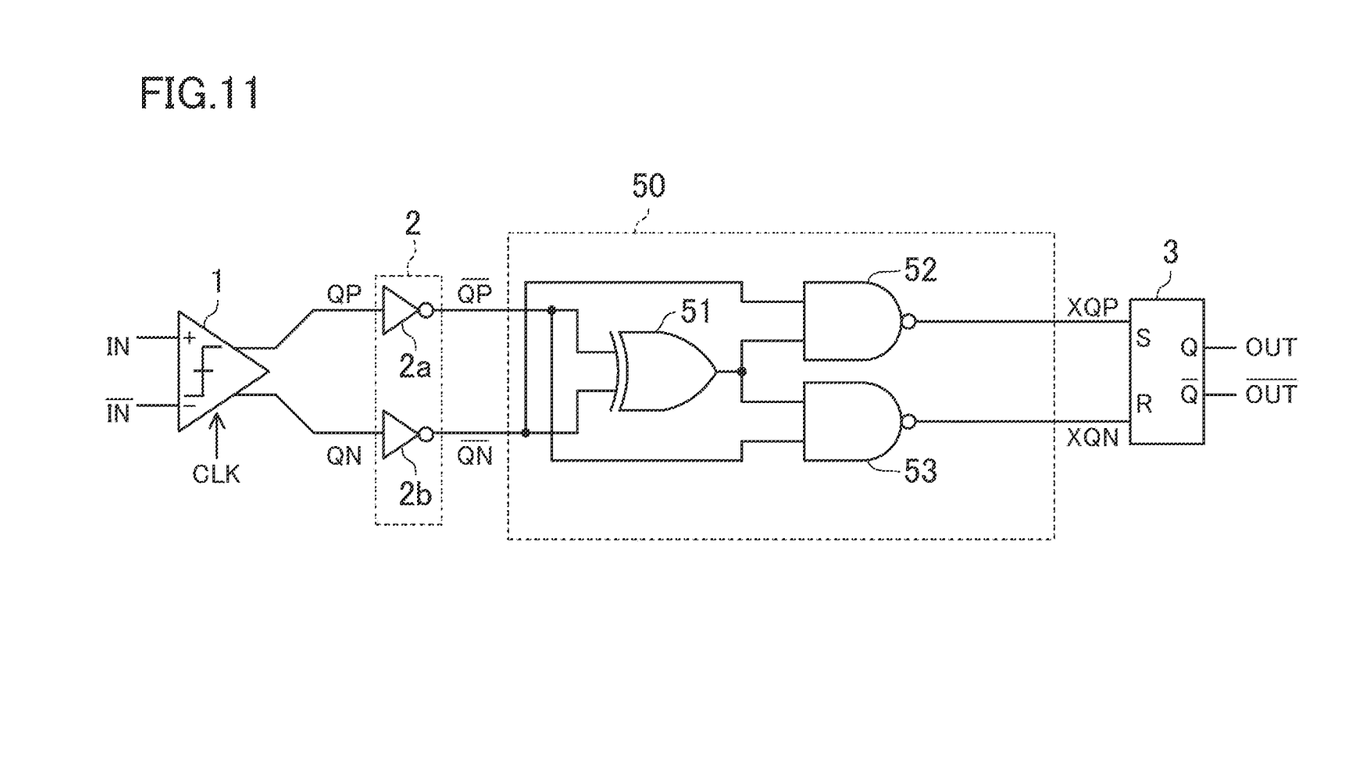
FIG. 11 is a circuit diagram showing a configuration including a comparator circuit according to the fourth embodiment.

FIG. 11 is a circuit diagram showing a configuration including a comparator circuit according to the fourth embodiment. In the configuration of FIG. 11, a logic circuit 50 uses an EXOR gate. That is, the logic circuit 50 includes an EXOR gate 51 receiving the signals /QP and /QN, a NAND gate 52 receiving the signal /QN and the output signal of the EXOR gate 51 as its inputs, and a NAND gate 53 receiving the signal /QP and the output signal of the EXOR gate 51 as its inputs.

The logical operation performed by the logic circuit 50 is the same as that by the logic circuit 10 shown in FIG. 1, which is as represented by the truth table of FIG. 3. That is, when the logical values of the signals /QP and /QN are different from each other, the digital signals XQP and XQN have the same logical values as the signals /QP and /QN, respectively. On the other hand, when the logical values of the signals /QP and /QN are the same, the values of the digital signals XQP and XQN are "11". That is, the values of the digital signals XQP and XQN never become "00".

In the first embodiment described above, the inverter 21, 23 is provided on one of the input routes of the NAND gate 22, 24. Therefore, there is a possibility that the timing of the signals input into the NAND gates 22 and 24 may become off due to production variations of the inverters 21 and 23, causing the possibility that the transition timing of the digital signals XQP and XQN may become off. In contrast to this, in this embodiment, one input of the NAND gate 52 and one input of the NAND gate 53 are the output of the EXOR gate 51, i.e., share the same output. In this embodiment, therefore, the transition timing of the digital signals XQP and XQN is prevented from becoming off.

<Configuration of A/D Converter>

Figure 12:
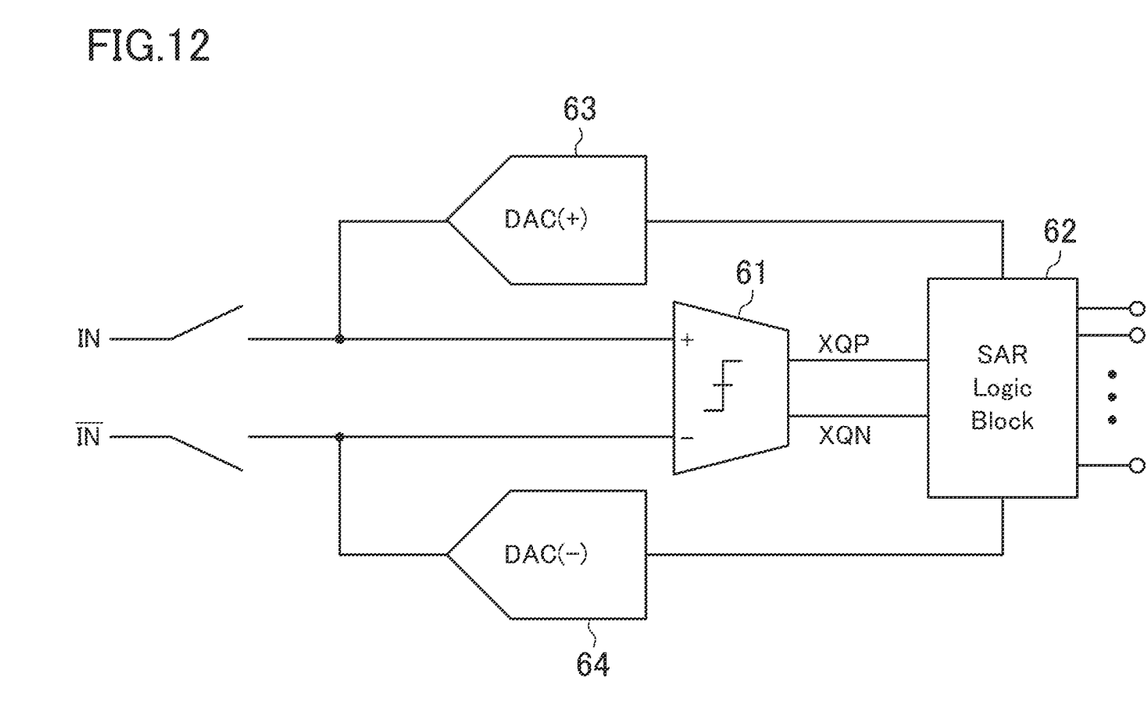
FIG. 12 shows a configuration example of an A/D converter using any of the comparator circuits according to the above embodiments.

The comparator circuits of the above embodiments can be used for A/D converters, for example. FIG. 12 shows a configuration example of a successive approximation type A/D converter. The successive approximation type A/D converter of FIG. 12 includes a comparator circuit 61, a SAR logic circuit 62, and capacitive digital/analog converters (DACs) 63 and 64. The comparator circuit 61 is implemented by any of the comparator circuits of the above embodiments. The SAR logic circuit 62 includes the RS flip-flop 3 shown in the above embodiments.

The capacitive DACs 63 and 64 sample the differential input signals IN and /IN. The comparator circuit 61 compares the magnitude of the sampled signals and outputs the digital signals XQP and XQN indicating which one is larger. The SAR logic circuit 62 sends signals corresponding to the digital signals XQP and XQN output from the comparator circuit 61 to the capacitive DACs 63 and 64. In this way, the output voltages of the capacitive DACs 63 and 64 are shifted and the operation moves to comparison of the next bit. After completion of the above operation for all bits, an output code is output from the SAR logic circuit 62.

Note that the configuration of the A/D converter provided with the comparator circuit according to any of the above embodiments is not limited to the one shown in FIG. 12.

In the above embodiments, the logic circuit of the comparator circuit is configured so that, when the signals /QP and /QN have logical values different from each other, the logic circuit outputs the signals having the same values as the signals /QP and /QN as the digital signals XQP and XQN, respectively. Alternatively, the configuration may be made so that, when the signals /QP and /QN have logical values different from each other, the logic circuit of the comparator circuit may output signals logically inverted from the signals /QP and /QN as the digital signals XQP and XQN, respectively. That is, the logic circuit may output "10" as the digital signals XQP and XQN when the signals /QP and /QN are "01", and output "01" as the digital signals XQP and XQN when the signals /QP and /QN are "10".

While "00" is the forbidden input combination for the flip-flop 3 receiving the outputs of the comparator circuit in the above embodiments, there is also a case where "11" is the forbidden input combination for a flip-flop. In this case, the logical operation by the logic circuit in the comparator circuit may just be set so as not to output "11". For example, in the logic circuit 10 in FIG. 1, an inverter may be provided on the output side of each of the NAND gates 22 and 24. Also, in the logic circuits 30 and 30A in FIGS. 10A and 10B, the inverters 43 and 46 may be omitted.

The present disclosure is not limited to the configurations described in the above embodiments, but many alterations can be made by those having ordinal skill in the art within the scope of the technical ideas of the present disclosure. Also, various components of the embodiments may be combined arbitrarily without departing from the spirit of the present disclosure.

According to the present disclosure, a comparator circuit that outputs digital signals corresponding to differential signals can be made not to output a forbidden input combination to a subsequent flip-flop. The present disclosure is therefore useful for improvement in the performance of LSI.

What is claimed is:

1. A comparator circuit receiving differential signals and outputting first and second digital signals corresponding to the differential signals to a flip-flop having a predetermined forbidden input combination, the comparator circuit comprising:
    a converter circuit performing differential amplification for the differential signals and converting the resultant signals to first and second signals that are complementary digital signals; and
    a logic circuit performing predetermined logical operation for the input first and second signals and outputting the first and second digital signals,
    wherein when the first and second signals have logical values different from each other, the logic circuit outputs the first and second digital signals corresponding to the logical values of the first and second signals, and when the first and second signals have a same logical value, the logic circuit outputs the first and second digital signals having a same value other than the predetermined forbidden input combination,
    the logic circuit includes:
        a first circuit receiving the first and second signals and outputting the first digital signal, and
        a second circuit receiving the first and second signals and outputting the second digital signal,
    the first circuit includes:
        a first inverter receiving the first signal, and
        a first NAND gate receiving the second signal and an output signal of the first inverter,
    the second circuit includes:
        a second inverter receiving the second signal, and
        a second NAND gate receiving the first signal and an output signal of the second inverter, and
    the first circuit includes a first delay circuit delaying the second signal and outputting the delayed signal to the first NAND gate, and
    the second circuit includes a second delay circuit delaying the first signal and outputting the delayed signal to the second NAND gate.

2. A comparator circuit receiving differential signals and outputting first and second digital signals corresponding to the differential signals to a flip-flop having a predetermined forbidden input combination, the comparator circuit comprising:

a converter circuit performing differential amplification for the differential signals and converting the resultant signals to first and second signals that are complementary digital signals; and a logic circuit performing predetermined logical operation for the input first and second signals and outputting the first and second digital signals, wherein when the first and second signals have logical values different from each other, the logic circuit outputs the first and second digital signals corresponding to the logical values of the first and second signals, and when the first and second signals have a same logical value, the logic circuit outputs the first and second digital signals having a same value other than the predetermined forbidden input combination, the logic circuit includes:
 a first circuit receiving the first and second signals and outputting the first digital signal, and
 a second circuit receiving the first and second signals and outputting the second digital signal, the first circuit includes:
 a first inverter receiving the second signal,
 a first NOR gate receiving the first signal and an output signal of the first inverter, and
 a second inverter receiving an output of the first NOR gate, and the second circuit includes:
 a third inverter receiving the first signal,
 a second NOR gate receiving the second signal and an output signal of the third inverter, and
 a fourth inverter receiving an output of the second NOR gate.

3. The comparator circuit of claim 2, wherein
the first circuit includes a first delay circuit delaying the first signal and outputting the delayed signal to the first NOR gate, and
the second circuit includes a second delay circuit delaying the second signal and outputting the delayed signal to the second NOR gate.

4. An A/D converter comprising the comparator circuit of claim 1.

5. An A/D converter comprising the comparator circuit of claim 2.

* * * * *